United States Patent [19]

Kazangey

[11] 3,998,088
[45] Dec. 21, 1976

[54] TESTING APPARATUS FOR INCREMENTAL SHAFT ENCODER

[75] Inventor: Thomas Kazangey, Cerritos, Calif.

[73] Assignee: The United States of America as represented by the Secretary of the Air Force, Washington, D.C.

[22] Filed: Nov. 12, 1975

[21] Appl. No.: 631,281

[52] U.S. Cl. .................................................. 73/1 E
[51] Int. Cl.² ...................................... G01C 25/00
[58] Field of Search ..................... 73/1 D, 1 E, 1 R; 33/1 SY; 340/158 SY, 63

[56] References Cited
UNITED STATES PATENTS

| | | | |
|---|---|---|---|
| 3,355,806 | 12/1967 | Brook | 73/1 E |
| 3,583,205 | 6/1971 | Erle | 73/1 D |

Primary Examiner—S. Clement Swisher
Attorney, Agent, or Firm—Joseph E. Rusz; Julian L. Siegel

[57] ABSTRACT

An apparatus for testing an incremental shaft encoder in which the encoder is placed upon a rate table together with a gyroscope to permit coincident rotation. Every time the shaft of the incremental shaft encoder turns through a complete cycle, the leading edges of a square wave output generated by the encoder, start and stop a counter which is fed by a frequency signal derived from the rotating gyroscope through a voltage-to-frequency converter. The counter output then is applied to a printer.

4 Claims, 3 Drawing Figures

TESTING APPARATUS FOR INCREMENTAL SHAFT ENCODER

STATEMENT OF GOVERNMENT INTEREST

The invention described herein may be manufactured and used by or for the Government for governmental purposes without the payment of any royalty thereon.

BACKGROUND OF THE INVENTION

This invention relates to incremental shaft encoders, and more particularly to a gyroscopic testing technique for determining the accuracy of the encoders.

In precision guidance and control applications, the angular rotation of a shaft is converted into a digital output by an angular position transducer called an incremental shaft encoder. Typically, the encoder is a transparent disk with alternating opaque and clear segments of equal angular extent that interrupt the path of a light source to a detector. The detector produces an electrical signal that is processed to generate a sequence of pulses, with each pulse representing an increment of rotation. Such encoders appear in many guidance and control applications requiring precise angular rotation measurement. Satisfactory evaluation of the pulse-to-pulse accuracy of such encoders has been lacking due to the precision measurements required and the time involved in performing these measurements.

Because these devices are used in a variety of control applications, a system using a rate-integrating gyroscope, rate table, digital processing electronics, and statistical analysis is presented here to determine rapidly and precisely the accuracy of the incremental shaft encoder. The accuracy of the encoder is defined as the rms value of the sequence of differences between the ideal interpulse angular increment (i.e., 360°/N, where N is the number of pulses per revolution) and the actual increment.

There have been previous attempts to determine the accuracy of incremental shaft encoders. The present invention is a significant advancement over these former methods, which are performed manually on an optical bench. The invention is more accurate and rapid than the former pulse-to-pulse calibration procedures; it calibrates every pulse rather than averaging over a large angle.

SUMMARY OF THE INVENTION

The present invention is a unique method and system for using a rate-integrating gyroscope, rate table, digital processing electronics, and statistical analysis to determine rapidly and precisely the accuracy of an incremental shaft encoder. The rate table is used to rotate both the gyroscope and the encoder input shaft as a function of the encoder output. Such encoders appear in many guidance and control applications requiring precise angular rotation measurement. These encoders typically produce a series of output pulses with each pulse representing an increment of rotation.

It is therefore an object of the invention to provide a method and system for testing an incremental shaft encoder.

It is another object to provide a system for determining the accuracy of an incremental shaft encoder that is extremely rapid and precise.

It is another object to provide a method and system of testing an incremental shaft encoder that calibrates every pulse rather than averaging over a large angle.

These and other objects, features and advantages of the invention will become more apparent from the following description when taken in conjunction with the illustrative embodiment in the accompanying drawings.

DETAILED DESCRIPTION OF THE PREFERRED EMBODIMENT

Figure 1:
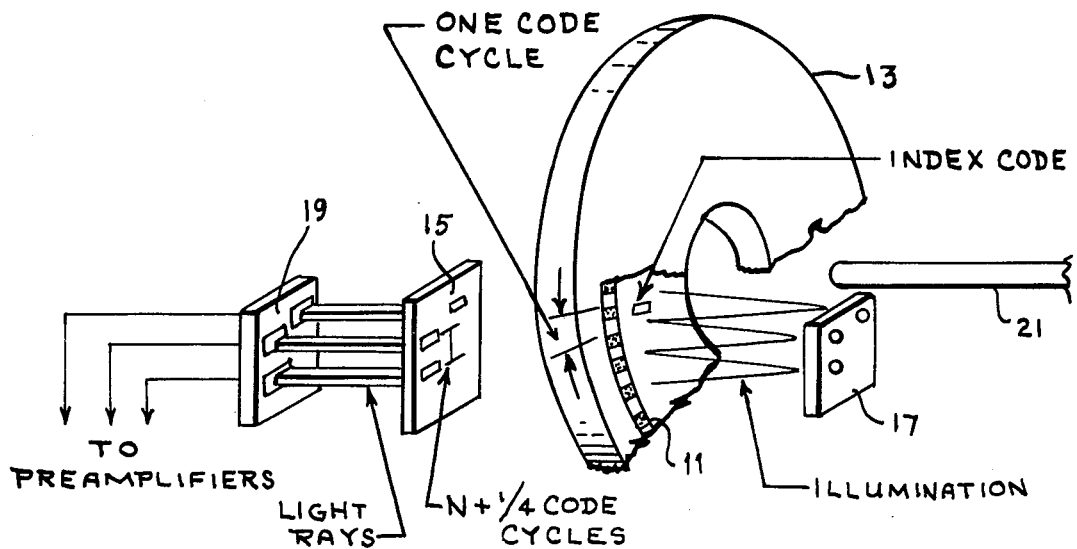
FIG. 1 is a schematic diagram of an incremental shaft encoder.

FIG. 1 illustrates the rotation detection principle of an incremental shaft encoder. Angular code pattern 11 on code disk 13 is a continuous series of alternating transparent and opaque segments, all having equal angles. Optical slits 15 are positioned on the opposite side of the code pattern from the illumination lamps and reflector 17. Photodetectors 19 located directly behind slits 15 respond to the light rays passing through the slits. As code disk 13 rotates, these rays are modulated by the code pattern and photodetectors 19 produce a modulated electrical output. The modulated output is fed to signal processing solid state circuits (preamplifiers) contained within the encoder, which provide a sequence of pulses. The encoder output pulse rate is a function of the angular velocity of encoder shaft 21. As an example of a particular encoder tested, 9000 pulses per revolution were generated, giving an ideal interpulse angular increment of 144 arc sec.

Figure 2:
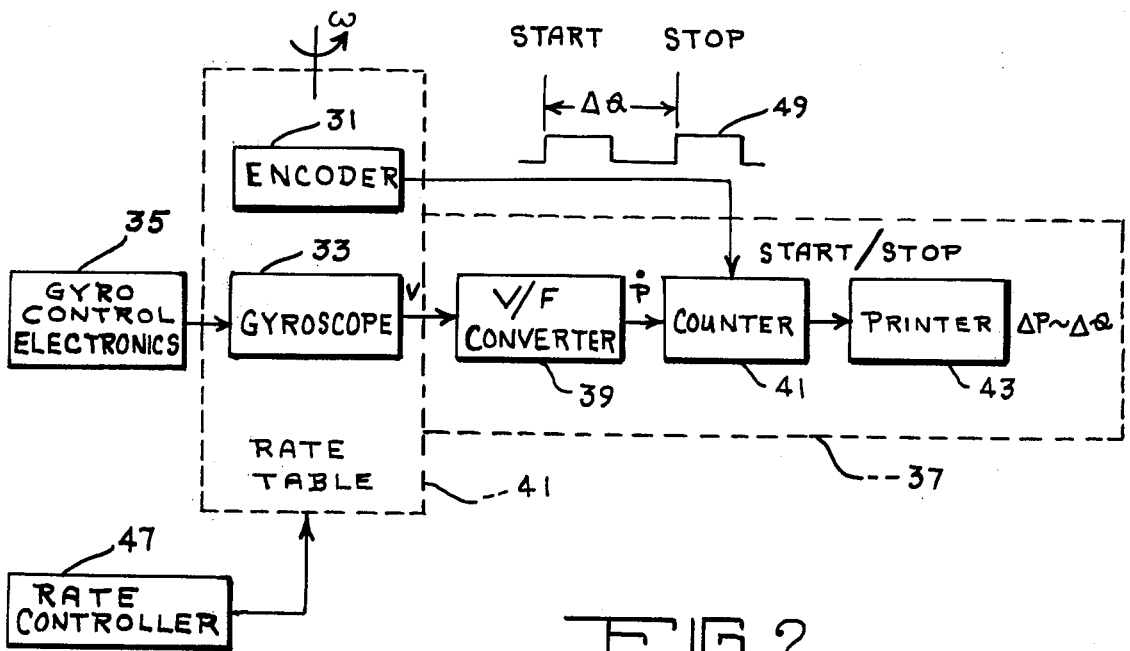
FIG. 2 is a basic block diagram of the incremental shaft encoder testing system.

A basic block diagram of the incremental shaft encoder testing system is shown in FIG. 2. The system includes incremental shaft encoder 31, rate-integrating gyroscope 33 and its control electronics 35, electronic monitoring equipment 37 including voltage-to-frequency converter 39, counter 41, and printer 43. Encoder 31 and gyroscope 33 are mounted on rate table 45 which is controlled by rate controller 47.

Gyroscope 33 can be housed in a holding fixture with its input axis vertical and fastened to rate table 45. Encoder 31 can be mounted in a hollow aluminum cup (not shown) with its shaft protruding out of one side of the cup. The encoder shaft, parallel to the input axis of the gyroscope, can be fastened to gyroscope 33 holding fixture by a flexible coupling to minimize the axial and radial loading on the shaft bearings. Thus, by rotating table 45, the encoder shaft and gyroscope can be rotated together.

The output of encoder 31 is a square wave in which the leading edge of one square wave cycle starts counter 41 and the leading edge of the next square wave cycle stops the counter. The difference between the two adjacent leading edges is equal to $\Delta\theta$, the angular difference of the encoder shaft.

Figure 3:
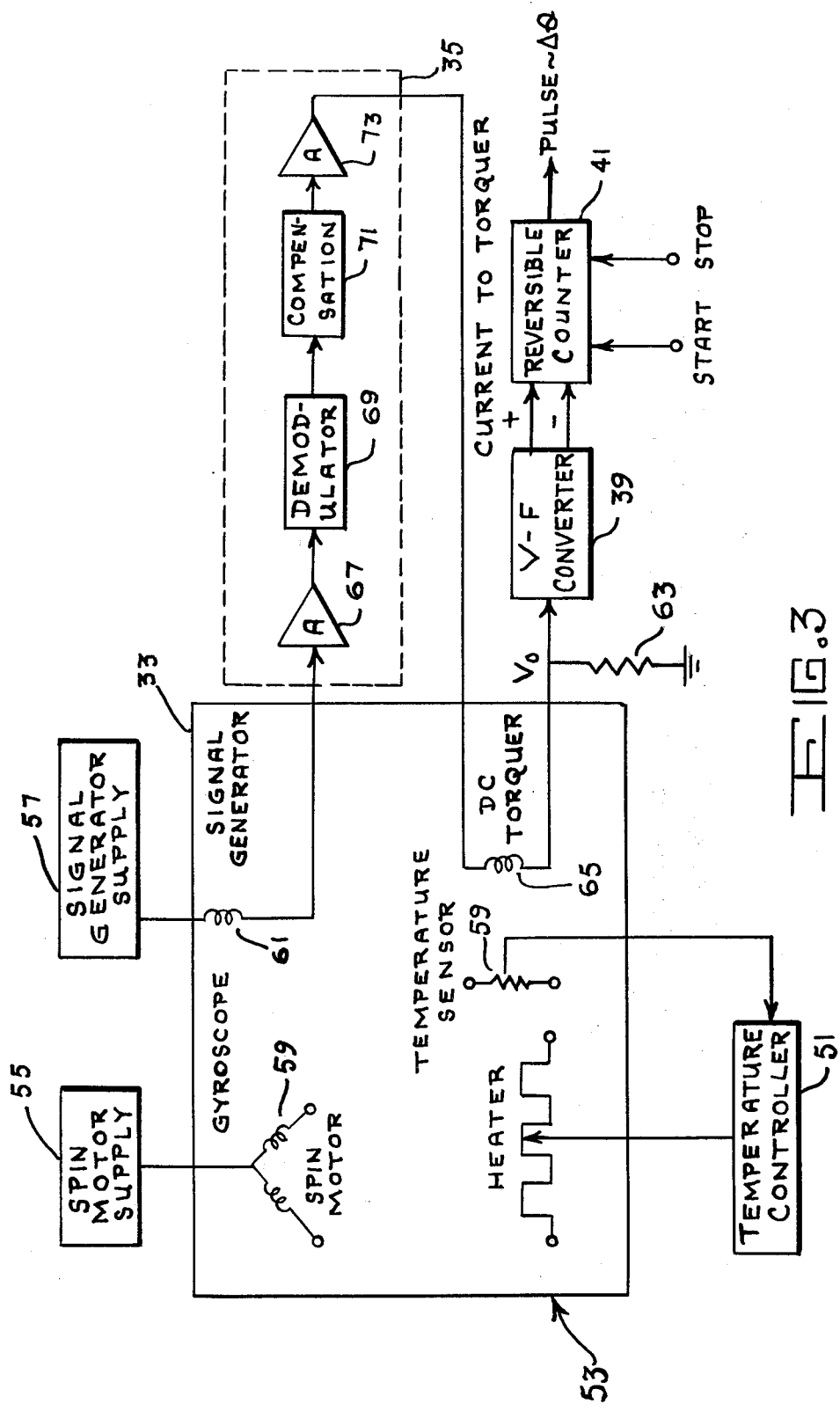
FIG. 3 is a block diagram of the incremental shaft encoder tested showing greater detail of the calibration instrumentation.

A block diagram of the gyroscope together with the control electronics and measuring instrumentation is shown in FIG. 3. Temperature controller 51, such as a Labac proportional controller, provides the direct current required by the heaters 53 to maintain the gyroscope temperature at 165° F. Controller 51 is activated by temperature sensor 54. Precision Hewlett-Packard Model 3300A oscillators can serve as inputs to spin motor supply 55 and signal generator supply 57 for spin motor 59 and signal generator 61, which are 26 Vrms at 800 Hz, and 5 Vrms at 7.2 KHz, respectively. A discussion of the gyroscope and its operation is found in T. Kazangey, Honeywell GG 334A *Gyro Torque Generator Scale Factor Linearity and Stability*, The Aerospace Corporation TOR-0073(3901-03)-7, 8 November 1972. The gyroscope control electronics 35 are shown in greater detail in this figure. The output of signal generator 61 is fed to preamplifier 67 which is then fed to demodulator 69 and then to compensation circuit 71. The output of compensation circuit 71 is amplified in DC amplifier 73 for connection to DC torquer 65 of the gyroscope.

Gyroscope 33 is a precision rate-integrating gyroscope and is mechanized as a rate sensor. Thus, as rate table 45 is rotated, gyroscope 33 senses this rate and generates a direct current proportional to the total rate about its input axis. The direct current is measured by placing precision resistor 63 in series with gyroscope DC torquer 65. The resulting DC voltage $V_o$ is fed to a voltage-to-frequency converter 39, such as a Vidar Model 260, which generates a sequence of pulses whose frequency is proportional to the input voltage and thus proportional to the table rate. The output pulses from voltage-to-frequency converter 39 are accumulated using counter 41, such as Hewlett-Packard Model 5280 reversible counter. The accumulated pulses are proportional to the rate table angular change during the accumulation time. Thus, the accumulated pulses will be proportional to the interpulse angular increment of the encoder if counter 41 is started from an encoder leading pulse edge and stopped at the adjacent leading pulse edge. The accumulated pulses are printed and punched out on a recorder such as a Hewlett-Packard Model 562 digital recorder.

In using the above-described apparatus, the rate-integrating gyroscope is mounted to the rate table with its input axis vertical and parallel to the axis of rotation of the table. For this particular orientation, the equation for the gyroscope torquer current is given as $$K_t i(t) = D_f + D_i + D_{ii} + \omega_i(t) + n(t) \qquad 1$$

where, $K_t$ = Torquer scale factor (deg/hr/mA)
$i(t)$ = torquer current (mA)
$D_f$ = acceleration insensitive drift rate (deg/hr)
$D_i$ = drift rate due to 1-g acceleration along input axis (deg/hr)
$D_{ii}$ = drift due to square of 1-g acceleration component along input axis (deg/hr)
$\omega_i(t)$ = angular velocity of the gyroscope case about input axis with respect to inertial space (deg/hr)
$n(t)$ = signal representing gyroscope output noise (deg/hr)

Equation (1) is a special case of the general equation for a single-degree-of-freedom rate-integrating gyroscope.

The gyroscope senses both table rate and fixed component of earth rate $$\omega_i(t) = \dot{\theta}_i(t) + \omega_e \sin \lambda \qquad 2$$

where $\dot{\theta}_i(t)$ = table rate (deg/hr)

$\omega_e \sin \lambda$ = component of earth rate sensed at a northern latitude of $\lambda$ (deg/hr).

Since the encoder draft is connected to the rate table, the encoder shaft rate is equal to the table rate. For convenience, the subscripts are deleted:

$$\dot{\theta}_i(t) = \dot{\theta}_e(t) = \dot{\theta}(t)$$

where $\dot{\theta}_e(t)$ = encoder shaft rate (deg/hr).

Equation (1) can be rewritten as $$K_t i(t) = \dot{\theta}(t) + n(t) + D \qquad 3$$

where $D = D_f + D_i + D_{ii} + \omega_e \sin \lambda$. An estimate of D can be obtained from a measurement of the torquer current with the table at rest.

The output voltage is generated by passing the torquer current through a precision resistor in series with the torquer $$v_o(t) = R_p i(t) \qquad 4$$

where $R_p$ = precision resistor ($\Omega$).

$v_o(t)$ = output voltage (mV).

The output voltage is fed to the voltage-to-frequency converter. The converter output is fed to the reversible counter. A model equation for the converter and counter combination, including the effect of quantization, is $$p(t-T, t) = K_V \int_{t-T}^{t} v_o(\tau)d\tau + Q \qquad (5)$$

where p(t - T, t) = value of moving integral at time $t$ after integrating for T sec
$K_v$ = voltage-to-frequency converter scale factor (pps/mV)
T = counting time interval (sec)
Q = error in equation due to quantization (pulses). Since the analysis indicated that quantization contributes negligible error to the encoder calibration, it is neglected in the following description.

By accumulating pulses for a time T and resetting the reversible counter to zero before reaccumulating pulses, a sequence of numbers is generated which can be expressed as $$p^*(t) = \sum_{n=1}^{N} p(t-T, t) \, \delta(t - nT) \qquad (6)$$

where p*(t) = impulse sequence corresponding to numbers indicated by reversible counter at time $t = nT$
$\delta(t-nT)$ = impulse of unit area occurring at time $t = nT$
N = number of encoder pulses per revolution.

Substituting equations (3) and (4) in equation (5), there is obtained:

$$p(t-T, t) = (K_v R_p/K_t) \int_{t-T}^{t} d\theta(\tau)$$

-continued $$+ (K_vR_p/K_t)\int_{t-T}^{t} n(\tau)d\tau + (K_vR_p/K_t)\int_{t-T}^{t} Dd\tau \quad (7)$$

This encoder calibration technique is unique; instead of starting and stopping the reversible counter in a temporal reference, it is started and stopped in a spatial reference. Thus, instead of accumulating pulses for a fixed time, the accumulating of the pulses are started from the leading edge of an encoder and stopped at the leading edge of the adjacent encoder pulse.

Integrating equation 7 from the $i^{th}$ encoder leading pulse edge to the $(i^{th}+1)$ encoder leading pulse edge, there is obtained $$P[\theta(i), \theta(i+1)] = (K_vR_p/K_t)[\theta(i) - \theta(i+1)]$$
$$+ (K_vR_p/K_t)\int_{t-T_{i,i+1}}^{t} n(\tau)d\tau + (K_vR_p/K_t)DT_{i,i+1} \quad (8)$$

where
P $[\theta(i), \theta(i+1)]$ = number of pulses accumulated in going from the $i^{th}$ encoder leading pulse edge to the $(i^{th}+1)$ leading pulse edge
$[\theta(i) - \theta(i+1)]$ = the $i^{th}$ interpulse angular increment
$T_{i,i+1}$ = time to go from the $i^{th}$ encoder leading pulse edge to the $(i^{th} + 1)$ leading pulse edge.

If we assume that the table rate is constant, the time between encoder pulses is $$T_{i,i+1} = \frac{[\theta(i) - \theta(i+1)]}{\dot{\theta}}$$

Substituting this expression into equation (8), we obtain $$P[\theta(i), \theta(i+1)] = (K_vR_p/K_t)(1 + D/\dot{\theta})[\theta(i) - \theta(i+1)]$$
$$+ (K_vR_p/K_t)\int_{t-T_{i,i+1}}^{t} n(\tau)d\tau \quad (9)$$

Solving for the $i^{th}$ interpulse angular increment, we get $$[\theta(i) - \theta(i+1)] = [K_t/K_vR_p(1 + D/\dot{\theta})] P[\theta(i), \theta(i+1)]$$
$$+ \int_{t-T_{i,i+1}}^{t} n(\tau)d\tau \quad (10)$$

The following parameter values were used in the encoder calibration:

$K_t$ = 1359 $\frac{\text{arc sec/sec}}{mA}$ $K_v$ = 995 $\frac{pps}{mV}$ $R_p$ = 100.01 $\Omega$ $D$ = −5.96 $\frac{\text{arc sec}}{\text{sec}}$ $\dot{\theta}$ = 144 $\frac{\text{arc sec}}{\text{sec}}$ Assuming that the gyroscope noise has zero mean, we obtain the best estimate of the interpulse angular increment by $$[\theta(i) - \theta(i+1)] = (0.142 \text{ arc sec/pulse}) P[\theta(i), \theta(i+1)]1 \leq i \leq 9000 \quad 11$$

What is claimed is:
1. Testing apparatus for an incremental shaft encoder comprising:
   a. a rotatable rate table supporting the incremental shaft encoder;
   b. a rate-integrating gyroscope mounted upon the rate table;
   c. a voltage-to-frequency converter fed by the gyroscope, the output being a series of pulses;
   d. means for counting the output pulses of the voltage-to-frequency converter, the counting means being activated and deactivated by the incremental shaft encoder output; and
   e. a printer fed by the counting means.
2. Testing apparatus for an incremental shaft encoder according to claim 1 wherein the output of the incremental shaft encoder is a square wave and the voltage-to-frequency converter is activated and deactivated by successive leading edges of the square wave.
3. Testing apparatus for an incremental shaft encoder according to claim 2 wherein the gyroscope includes:
   a. a signal generator; and
   b. a DC torquer fed by the signal generator, the output of the DC torquer being fed to the voltage-to-frequency converter.
4. Testing apparatus for an incremental shaft encoder according to claim 3 wherein the gyroscope further includes:
   a. heaters;
   b. a temperature sensor; and
   c. means interposed between the heaters and the temperature sensor for controlling direct current to the heaters.

* * * * *